United States Patent [19]

Deville

[11] Patent Number: 4,918,337
[45] Date of Patent: Apr. 17, 1990

[54] ACTIVE RC FILTER HAVING BAND-REJECTION AND ALL-PASS MODES

[75] Inventor: Yannick Deville, Ris-Orangis, France

[73] Assignee: U.S. Philips Corp., New York, N.Y.

[21] Appl. No.: 257,361

[22] Filed: Oct. 12, 1988

[30] Foreign Application Priority Data

Oct. 13, 1987 [FR] France ............................ 87 14111

[51] Int. Cl.⁴ ...................... H03B 1/00; H03K 5/00
[52] U.S. Cl. .................................. 307/520; 328/155; 328/167; 330/306
[58] Field of Search ............... 307/520, 521; 328/155, 328/167; 330/295, 302, 306

[56] References Cited

U.S. PATENT DOCUMENTS

| | | | |
|---|---|---|---|
| 3,652,952 | 3/1972 | Chen | 330/295 |
| 4,001,712 | 1/1977 | Chambers et al. | 330/107 |
| 4,238,744 | 12/1980 | Iwahara | 328/167 |
| 4,301,420 | 11/1981 | Sugawara | 330/295 |
| 4,388,595 | 6/1983 | Brooks | 328/155 |
| 4,792,744 | 12/1988 | Antoine | 328/155 |

Primary Examiner—Stanley D. Miller
Assistant Examiner—Timothy P. Callahan
Attorney, Agent, or Firm—Emmanuel J. Lobato

[57] ABSTRACT

An active filter circuit operable in a band-rejection mode and in an all-pass mode. A cascade combination of an RC filter and amplifier circuit receives an input signal. A pair of amplifiers respectively receive the input signal and the output of the RC filter and amplifier combination. The outputs of the amplifier pair are summed, and the circuit mode is determined by the RC component values and the amplifier gains.

13 Claims, 3 Drawing Sheets

ACTIVE RC FILTER HAVING BAND-REJECTION AND ALL-PASS MODES

BACKGROUND OF THE INVENTION

The invention relates to a circuit constituting an active RC filter for band-rejection or all-pass applications in the high frequency and microwave regions.

The invention is used to provide integrated circuits for high-frequency and microwave filters which can, for example, be used in one embodiment as a band-rejection filter in frequency doublers to reject the unwanted signal at the fundamental frequency or, in another embodiment, can be used as an all-pass filter in so far as they are adjustable phase shifters at a given frequency or as all-pass filter in so far as they are elements constituting wide-band 90 degrees phase shifters.

As active all-pass filter is already known from the publication by J. TOW in "IEEE Spectrum, December 1969, pp. 64–68", entitled "A Step-by-step Active-filter Design".

This publication describes, inter alia, a version of an all-pass filter having a biquadratic transfer function, which filter is shown in FIG. 8 of said publication. This circuit comprises three operational amplifiers which are arranged in series, this chain being fed back. A fourth operational amplifier takes the sum of the output of the third operational amplifier and the input of the filter circuit.

The operational amplifiers used to form this circuit have a gain which is certainly infinite for low frequencies, but which becomes very weak for high frequencies and microwaves. For that reason, the circuit disclosed in said document has the disadvantage that it cannot be used in these frequency domains.

On the other hand, the feedback chain has the disadvantages that in certain circumstances it causes the circuit to oscillate.

FIG. 6 of said publication also shows an active bandpass filter which has characteristics which are similar and consequently have the same disadvantage.

The circuits disclosed in said publication have moreover the following drawbacks: on the one hand, they are formed by a large number of transistors, which increases manufacturing cost in all cases to a high level, causes a large surface area to be occupied and is disadvantageous for the use in integrated circuits, and has a high power consumption and is also not suitable for the above application. On the other hand, their characteristic frequency is not adjustable. Finally, the capacitors used in this circuit are of a considerable dimension and are the reason that this circuit is not integrable.

SUMMARY OF THE INVENTION

The present invention proposes an active filter circuit which does not have these drawbacks and which more specifically can operate for high frequency or microwave applications and, in the case they are used for very high frequencies is easily integrable and has a small surface and a low power consumption; and have such characteristics that the frequency characteristic is adjustable.

According to this invention, this object is achieved by means of a circuit characterized in that it comprises a block amplifier $A_2$ arranged in series with the filter-amplifer block arranged between the output thereof and the output of the circuit. An input signal $V_E$ is applied to the adder block via an amplifier $A_1$, in that the adder block $S_3$ is formed by coupling the outputs of the amplifier blocks $A_1$ and $A_2$ to form the output S of the circuit at which the output signal $V_S$ is available.

BRIEF DESCRIPTION OF THE DRAWING

The invention and how it can be put into effect will be better understood from the following description which is given by way of non-limitative example with reference to the accompanying drawings, in which:

FIG. 2b shows the equivalent circuit of the passive portion PB of the block F of the circuit of FIG. 2a;

FIGS. 2c and 2d show the curves of the ratio between the output and input voltages of the circuit versus frequency, as regards amplitude and phase, respectively, these curves being obtained by simulation of the circuit shown in FIG. 2a.

DETAILED DESCRIPTION OF THE INVENTION

Figure 1:
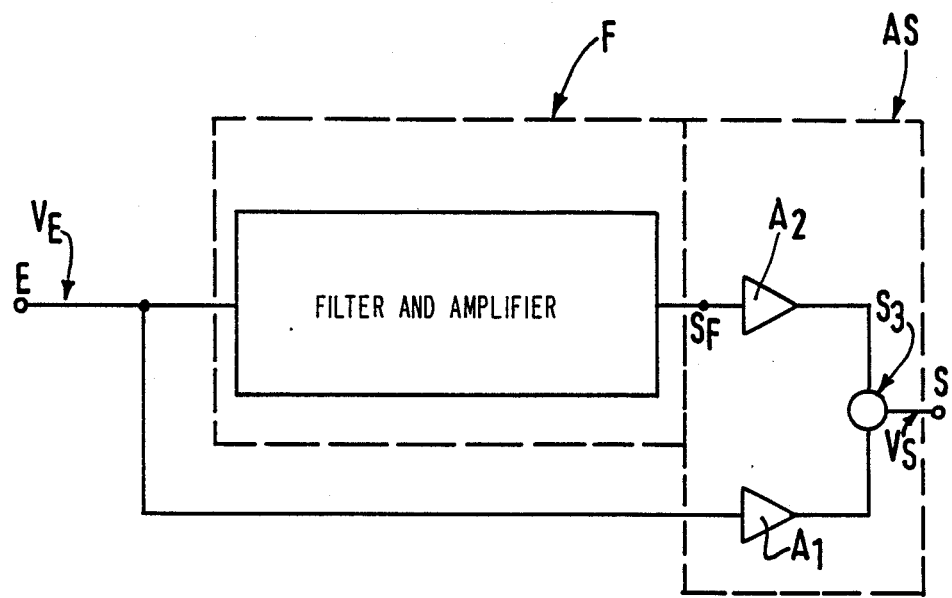
FIG. 1 shows the circuit diagram of the circuit according to the invention.

For a still better understanding of the invention it is pointed out that the transfer function of an active second-order band-rejection filter is given in a Table on pages 94–95 of the book "Filtres Actifs" by Paul BILDSTEIN in "Editions de la Radio" (9 Rue Jacob, Paris, France).

For an ideal second order band-rejection filter, thus transfer function is written in accordance with the relation (1) of Table I; in which relations is the Laplace variable which is derived from the variable p utilized in said article (p being the reduced Laplace variable) by the relation (2) of the Table I, while the relation (3) of Table I holds true.

The other parameters of the transfer function (1) are defined in the cited reference article, such as:

$\omega_1$ = rejection angular frequency for which the relation (4) is strictly obeyed and consequently for which the rejection is a total rejection;

$Q_o$ = quality or selectivity factor indicating the steepness of the slopes of the curve $|F(j\omega)|$ near $\omega_1$;

$\omega_0$ = the angular frequency associated with the poles of the transfer function. it is chosen here to have the notation $\omega_0$ correspond to the notation $\omega_p$ of the cited reference book;

G = the gain of the circuit at low frequencies (when $\omega \rightarrow 0$ and when $s \rightarrow 0$, the factor term of G is reduced to 1, and $F(j\omega) \rightarrow G$).

The transfer function of a circuit which is no longer ideal but has a real fixed structure, for which no conditions are imposed on the value of the elements is, in the most simple case, of the second order and is expressed by the relation (5).

Here, for practical reasons of simplicity, the greatest interest is for the case in which $\omega_1 = \omega_0$ independent of the values of the filter elements, and wherein, $Q_1$ being the rejection factor, the relation (6) must be checked to ensure that the filter functions is a band-rejection filter, which results in one of the two relations (7) or (8).

A new parameter of the filter then becomes apparent which is the rejection R of the filter given by the relation (9) when it is assumed that $\omega_1 \simeq \omega_0$.

The higher the absolute value of $Q_1$ (written $|Q_1|$) the better is the rejection R. At its limit, the rejection R is total when $|Q_1|$ is infinite.

The real band-rejection filters can then be classified in two classes:

(a) the first class corresponds to the case in which $Q_1$ is finite, and exceeds 0 (relation (7)), whatever the elements of the filter. In these conditions, the filters cannot effect a total rejection. The limits of the filter are determined by the maximum value of $Q_1$. Actually, for a given value of $Q_1$, when the value of $Q_0$ increases, the rejection R decreases.

(b) the second class corresponds to the case in which the fact whether $Q_1$ is higher than or less than 0 depends contrary to the first class of filters, on the elements of the filter. In this case, there are specific values of the elements such that the relation (10) is satisfied, and in which the rejection R is total. The transfer function G(s) given by the relation (5) is then reduced to the function F(s) given by the relation (1).

The filters belonging to the second class have more specifically the property that they can be realized by choosing elements such as $Q_1 = -Q_0$ (and with $\omega_1 = \omega_0$), which results in the relation (11).

The filter then becomes of the second order all-pass type. The phase difference between the output and the input signals passes from 0 to $-2\pi$ when $\omega$ varies from 0 to infinity.

The main object of the invention is to provide active filters, comprising a lowest possible number of elements so as to facilitate integration, and functioning at high and microwave frequencies.

To this effect, the integrated circuits of the filters according to the invention will advantageously be realized on gallium arsenide (GaAs).

Moreover, in accordance with the invention, one has opted for providing active band-rejection filters of the second class, which, among other advantages, renders it possible to obtain: a significant and easily controllable rejection R; a selectivity which is equally large as that of prior art passive filters described in hereafter.

The filters according to the invention can be used with advantage in frequency doublers to reject the unwanted signal at the fundamental frequency. In an all-pass filter type according to the invention, they can be used as active adjustable phase shifters at a given frequency, the phase delay being controlled by an imposed variation at $\omega_1$.

On the other hand, band-rejection filters of the second class which operate at high frequencies are also known from the state of the art. But these circuits are realized by means of passive elements. Examples are, for example, the "Robinson bridge" circuit which is also known as a "Wien bridge", which is shown at page 121 of the reference book "Electric Filters" by T. H. Turney (Pitman and Sons, London, England, 1945). This circuit, although it is quite capable of operating at high frequencies, has several disadvantages and more specifically: a differential output, a high output impedance, and a gain which is less than unity, at low frequencies, because of the fact that it is assembled from passive elements.

The functional circuit diagram of the band-rejection circuit according to the invention is shown in FIG. 1. This circuit is formed from two portions which are bounded by broken lines in this FIG. 1: a first portion F functioning as a band-pass filter (PB), and as an amplifier; and a second portion AS which functions as an adder amplifier.

The block F has the relation (12) as its transfer function. As a result thereof, the transfer function of the overall circuit is G(s) defined by the relation (5), by using, relative to the variables defined in the foregoing, the new variables in accordance with the relations (13) and (14).

The block AS is formed by an amplifier $A_1$ having a gain $K_1$ and an amplifier $A_2$ having a gain $K_2$. The amplifier $A_2$ is arranged in cascade with the block F, while the amplifier $A_1$ is arranged in parallel with the branch formed by F and $A_2$. The block $S_3$ takes the sum of the outputs of the amplifiers $A_1$ and $A_2$, and produces the output signal $V_S$ of the circuit according to the invention, whose input signal $V_E$ is applied to the junction point of the input of the block F and the amplifier $A_1$.

In these conditions the relation (15) can be written.

By identifying the terms of the preceding relation and the terms of the relation (5), the relation (16) and $G=K_1$ are obtained. Consequently, the circuit according to the invention constitutes a band-rejection filter of the second class defined in the foregoing, which can realize a total rejection. It can also be highly selective, as the selectivity basically depends on the structure of the block F and not on the overall circuit of FIG. 1. It can also be used as an all-pass filter and more generally it can continuously be adjusted from band-rejection to all-pass by adjusting $Q_1$.

Embodiment I

Figure 2B:
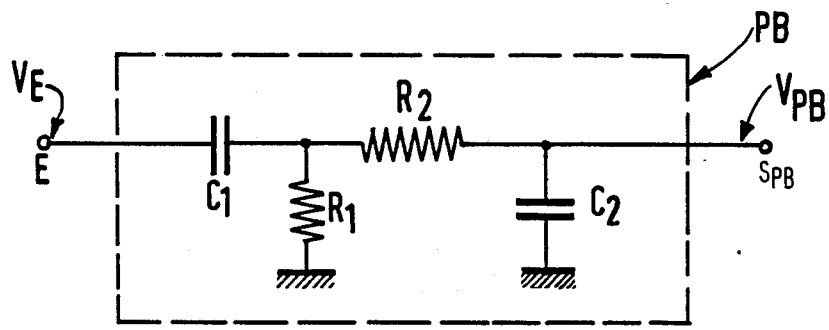
Figure 2A:
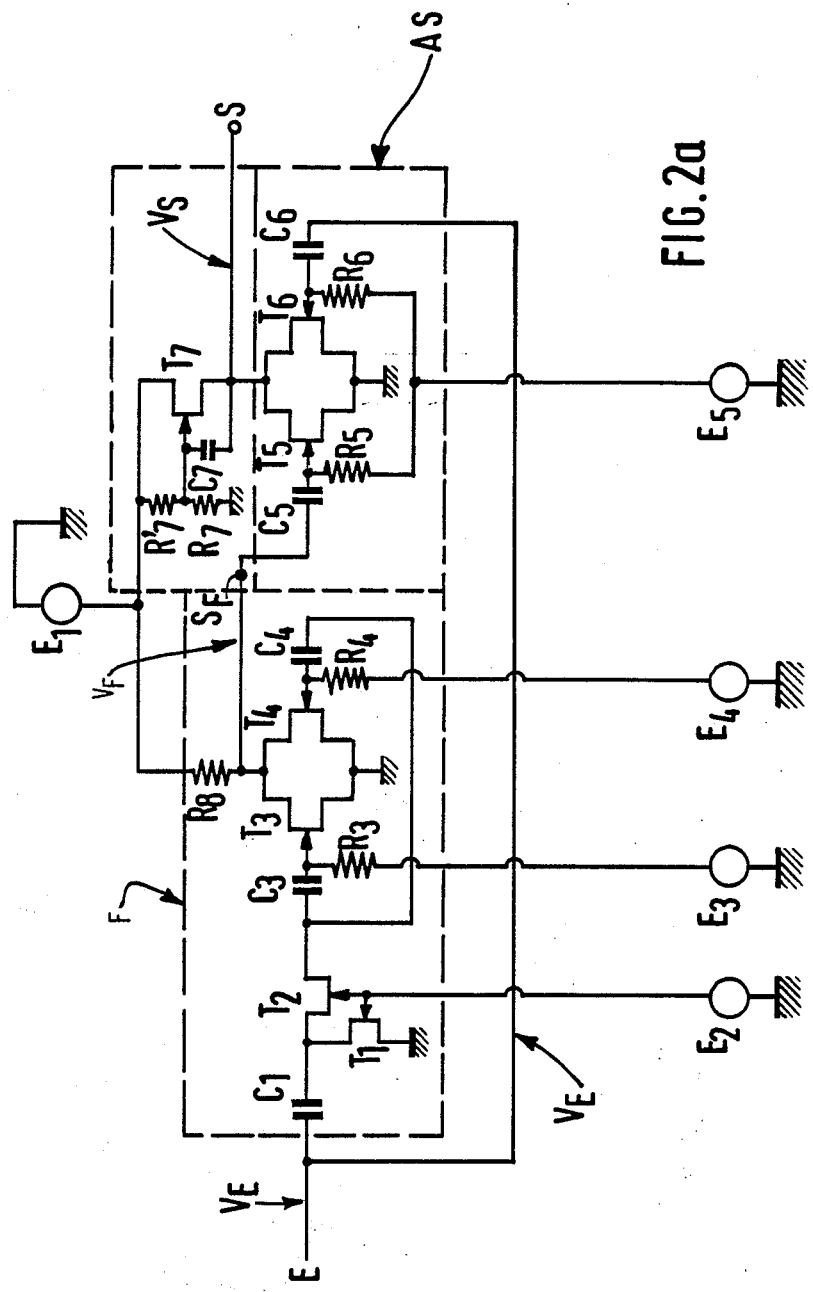
FIG. 2a shows an embodiment of the circuit according to the invention using field-effect transistors.

This embodiment is illustrated by FIG. 2a.

For its passive portion the block F has as its equivalent circuit diagram the circuit PB shown in FIG. 2b. It is consequently equivalent to a capacitor $C_1$ arranged in series with a resistor $R_2$, a resistor $R_1$ being arranged between the junction of $C_1$ and $R_2$, and ground; and a capacitor $C_2$ being arranged between the second terminal of $R_2$ and ground.

In FIG. 2a, the circuit PB comprises the field-effect transistors $T_1$ and $T_2$ instead of the resistors $R_1$ and $R_2$ of the circuit diagram of FIG. 2b, and used as variable resistors controlled by the voltage source $E_2$.

The capacitance $C_1$ of the equivalent circuit diagram 2b is formed from the capacitor $C_1$ of the circuit of FIG. 2a. The capacitor $C_2$ of the equivalent circuit diagram of FIG. 2b is formed from intrinsic capacitancs of the transistors $T_3$ and $T_4$ of the circuit shown in FIG. 2a. The field-effect transistors $T_3$ and $T_4$ are arranged in parallel, their source is connected to ground. The gate of the transistor $T_3$ is controlled by the signal transmitted by $T_2$ and is biased by a voltage source $E_3$ via a resistor $R_3$.

The gate of the transistor $T_4$ is controlled by the same signal and is biased by the voltage source $E_4$ via a resistor $R_4$. The capacitors $C_3$ and $C_4$ shown in FIG. 2a are isolating capacitors.

The common drain of the transistors $T_3$ and $T_4$ is moreover connected to a power supply source $E_1$ via a load resistor $R_8$. The output signal $V_F$ of this stage F is available at the common drains of the transistors $T_3$ and $T_4$.

This overall assembly consequently constitutes the block F of the circuit according to the invention. This assembly can be split, as regards its mode of operation, into two portions. The first portion equivalent to $C_1$, $R_1$, $R_2$ of the circuit of FIG. 2b is then formed from $C_1$, $T_1$, $T_2$ of FIG. 2a. It has no gain. The second portion equivalent to $C_2$ of the FIG. 2b and to the amplifier portion of the block F is formed from $T_3$, $T_4$, of FIG. 2a, and has a gain near $(-G_{PB})$.

According to the invention, an adjustable rejection frequency $f_1$ of the filter PB has been opted for. This control of the rejection frequency $f_1$ is obtained by an appropriate variation of the gate biasing voltage $E_2$ of the transistors $T_1$ and $T_2$ of the first portion. The voltage $E_2$ will advantageously be applied to the gates of the transistors $T_1$ and $T_2$ via a resistor of the order of magnitude of 10 kOhm, which will have for its effect to protect the transistors and to increase the rejection frequency $f_1$ somewhat.

On the other hand, during use of the circuit according to the invention, one may be induced to have the circuit operate at frequencies which are relatively near the cut-off frequency of the amplifier stage of the circuit F. In these circumstances, this amplifier stage produces a phase delay which brings the rejection frequency $f_1$ to significantly below the central frequency of the band-pass filter PB. As the gain of the transistors also varies significantly with the frequency, in the range utilized for $f_1$, this will render it necessary to modify the biasing of the second amplifying portion comprising $T_3$ and $T_4$ when $f_1$ is modified.

According to the invention, this bias control can easily be effected because of the fact that $T_3$ and $T_4$ are arranged in parallel and are biased separately by $E_3$ and $E_4$.

Biasing $T_4$ by $E_4$ via $R_4$ allows a coarse adjustment of the gain ($-G_{PB}$) of the stage F and of the rejection R.

Biasing $T_3$ by $E_3$ via $R_3$ allows fine adjustment of the rejection R.

To this effect, $E_4$ is fixed as a function of $E_3$. And the control of $E_3$ must be rather accurate. But this precision is only required in a small range.

It will also be noted that the choice of rendering $f_1$ adjustable is made to obtain inter alia the following two advantages:

(a) the possibility of adjusting the value of $f_1$ whose integrated circuits always supply widely spread values, because of the widely varying characteristics of the elements in one circuit relative to the other;

(b) the possibility to use the same circuit at several different frequencies.

Looking again at the functional circuit diagram of FIG. 1, the blocks $A_1$, $A_2$ and $S_3$ are represented by the block AS (amplifier-adder) bounded by the broken lines in FIG. 2a. The field-effect transistor $T_5$ represents the amplifier $A_2$ having a gain ($-K_2$). The field-effect transistor $T_6$ represents the amplifier $A_1$ which has a gain of ($-K_1$).

The transistors $T_5$ and $T_6$ are arranged in parallel, their source is connected to ground, and the output signal $V_S$ is available at their common drain, which thus realizes the desired function of the adder $S_3$.

The transistor $T_5$ receives at its gate the output signal $S_F$ of the amplifying portion of the stage F, that is to say the signal available on the common drain of the transistors $T_3$ and $T_4$. The transistor $T_6$ receives at its gate the input signal $V_E$. The gate of the transistors $T_5$ and $T_6$ are moreover biased via the respective resistors $R_5$ and $R_6$, by the voltage source $E_5$. The common drain of the transistors $T_5$ and $T_6$ is brought to the supply voltage $E_1$ via the load formed by the resistors $R'_7$ and $R_7$, and by the transistor $T_7$ whose gate is connected to the source via the capacitor $C_7$.

The stage F is isolated from the stage AS by the capacitor $C_5$.

It will here be noted that the gain of the block F is $-G_{PB}$, the gain of $A_2$ is $-k_2$ and the gain of $A_1$ is $-k_1$, which amounts to adding a phase shift $\pi$ relative to the functional circuit diagram of FIG. 1.

On the other hand, the voltage source $E_5$ whose voltage is applied to the gates of the transistors $T_5$ and $T_6$ via the respective resistors $R_5$ and $R_6$, determines the gains of these transistors. Since it is not absolutely necessary to obtain a very accurate value for this voltage, the voltage source $E_5$ can be combined with one of the gate bias sources, for example with $E_3$.

The Table II shows, by way of non-limitative examples, the values of the elements for putting the circuit of FIG. 2a into effect using field-effect transistors of the normally on type having a voltage treshold of the order of:

$V_T = -2.5$ Volt, and a gate length $l = 0.7$ μm.

The circuit obtained using the field-effect transistors having a gate width L shown in the Table II on gallium arsenide and further elements of the Table II, has given the following results:

for $E_2 = 0$ V, $f_1 = 3.25$ GHz for $E_2 = -1.8$ V, $f_1 = 1$ GHz.

Above these values, that is to say for $E_2 < -1.8$ V, $f_1$ generally decreases when $E_2$ decreases, but then requires a more critical adjustment.

As regards the rejection R, when the value of the voltage source $E_3$ is controlled with a precision of $\pm 25$ mV, the rejection R always is:

$R = 50$ dB at $f_1 = 3.25$ GHz and $R \geq 48$ dB at $f_1 = 1$ GHz.

It will be noted that at $f_1 = 1$ GHz, the value of the rejection R is lower as the transistor $T_3$ participates more in the gain of the amplifier of the circuit F.

As regards the gain obtained by the circuit, this gain is:

$G = 10$ dB.

Biasing the amplifier stage of F was such that: $f_1 = 3.25$ GHz was obtained for $E_4 = -0.85$ V and $E_3 = -0.815$ V and $f_1 = 1$ GHz was obtained for $E_4 = -1.7$ V and $E_3 = -0.830$ V.

Figure 2C:
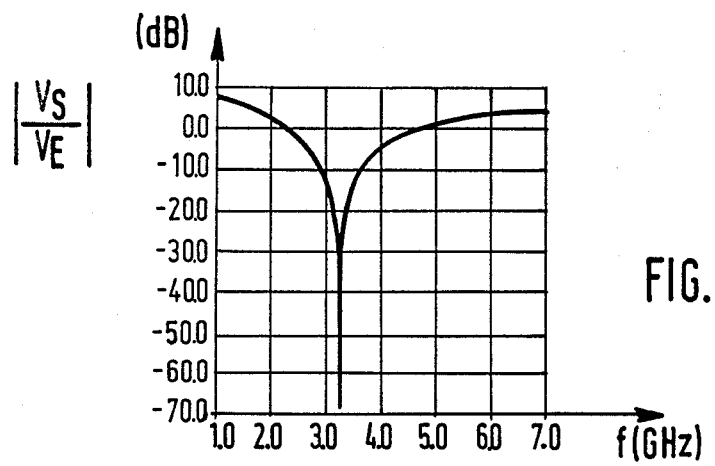
Figure 2D:
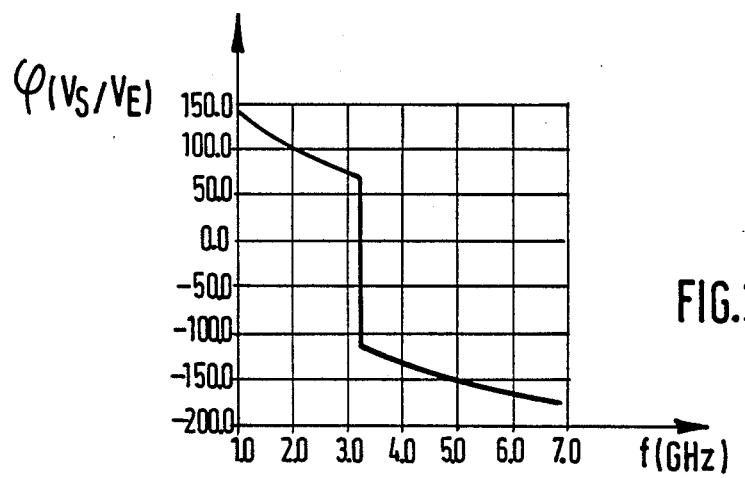

Finally, by way of example, the amplitude response of the filter of FIG. 2a as a function of the frequency f is represented by the curve of FIG. 2c, which is obtained by computer simulation; and the curve of the phase shift $\phi$, which was also obtained by computer simulation, between the output signal $V_s$ and the input signal $V_E$ as a function of the frequency f is shown in FIG. 2d.

Reverting to the equation (16) which applies, as has been described in the foregoing, to the present circuit, it has already been remarked hereinbefore that:

(a) the filter circuit according to the invention is of the band-rejection type when the relation (6) is satisfied. The structure according to the invention renders it possible to obtain a positive or a negative value for $Q_1$ and to satisfy relation (10).

(b) the circuit according to the invention also renders it possible to obtain $Q_1 = -Q_0$, which corresponds to the case in which the circuit has the all-pass function. The circuit according to the invention renders it possible to pass from the band-rejection function to the all-pass function using the same elements.

It is actually sufficient to have the bias of the gates of the transistors of the different stages vary, to obtain the variation
either of $k_1$,
either of $k_2$,
either of $G_{PB}$.
It is then possible to change in a continuous manner from:

$Q_1 = -\infty$ (band-rejection) to $Q_1 = -Q_0$ (all-pass).

TABLE I $$F_s = G \cdot \frac{(s/\omega_1)^2 + 1}{(s/\omega_o)^2 + (1/Q_o)(s/\omega_o) + 1} \quad (1)$$

$P = s/\omega_1$ (2)
$S = j\omega$ (3)
$F(jw_1) = 0$ (4)

$$G(s) = G \cdot \frac{(s/\omega)^2 + (1/Q_1)(s\omega_1) + 1}{(s/\omega_o)^2 + (1/Q_o)(s/\omega_o) + 1} \quad (5)$$

$|Q_1| > Q_o$ (6)
$Q_1 > Q_o$ (7)
$Q_1 < -Q_o$ (8)

$$R = \frac{|F(j\omega)| \cdot \text{maxium}}{|F(j\omega)| \cdot \text{minimum}} = \frac{|F(o)|}{|F(j\omega_1)|} = \frac{|Q_1|}{Q_o} \quad (9)$$

$1/Q_1 = 0$ (10)
$|G(j\omega)| = G = \text{constant}$ (11)

$$H(s) = G_{PB} \frac{s/\omega_{PB}}{(s/\omega_{PB})^2 + (1/Q_{PB})(s/\omega_{PB}) + 1} \quad (12)$$

$\omega_1 = \omega_o = \omega_{PB}$ (13)
$Q_0 = Q_{PB}$ (14)
$V_s/V_E = H(s) \cdot k_2 + k_1$ $$= -k_2 \cdot G_{PB} \frac{s/\omega_{PB}}{(s/\omega_{PB})^2 + (1/Q_{PB})(s/\omega_{PB}) + 1} + k_1$$

$$= k_1 \frac{(s/\omega_{PB})^2[(1/\omega_{PB}) - (k_2/k_1)/G_{PB}](s/\omega_{PB}) + 1}{(s/\omega_{PB})^2 + (1/\omega_{PB}) + 1} \quad (15)$$

TABLE II

| CAPACITORS (pF) | | Resistors (k) | | Transistors L (μm) | | Voltage | |
|---|---|---|---|---|---|---|---|
| $C_1$ | 0,2 | $R_3$ | 20 | $T_1$ | 10 | $E_1$ | 6 |
| $C_3$ | 0,5 | $R_4$ | 20 | $T_2$ | 10 | $E_2$ | $0 \rightarrow -1,8$ |
| $C_4$ | 0,5 | $R_5$ | 10 | $T_3$ | 20 | $E_3$ | $\simeq -0,8$ |
| $C_5$ | 1,0 | $R_6$ | 10 | $T_4$ | 20 | $E_4$ | $-0,85 \rightarrow -1,7$ |
| $C_6$ | 1,0 | $R_8$ | 0,6 | $T_7$ | 20 | | |
| $C_7$ | 1,0 | $R_7$ | 10 | $T_5$ | 20 | $E_5$ | $-0,8$ |
| | | $R_7$ | 14 | $T_6$ | 20 | | |

What is claimed is:

1. An active filter circuit operable in a band-rejection mode and in an all-pass mode, comprising:
a filter and amplifier circuit comprising filtering means comprised of an RC filter circuit for filtering an input signal applied thereto, said filtering means having a transfer function which is of the first order in the numerator and of the second order in the denominator and amplifying means for amplifying the output of said filtering means;
an amplifier circuit for amplifying the input signal applied to said filter and amplifier circuit;
a second amplifier circuit for amplifying the output of said filter and amplifier circuit; and
summing means for summing the respective output signals of said first and second amplifier circuits; whereby
the active filter circuit has a transfer function which is of the second order in the numerator and second order in the denominator and the active filter mode can be changed between a band-rejection mode and an all-pass mode by changing the RC component values and amplifying means and amplifier gains.

2. A circuit as claimed in claim 1, characterized in that the filter-amplifier block F is an active circuit containing a block functioning as an amplifier and a block PB functioning as a second-order bandpass.

3. A circuit as claimed in claim 2, characterized in that the circuit F is equivalent, as regards its passive portion PB to a filter constituted by a capacitor $C_1$ and a resistor $R_2$ arranged in series between its input E and its output $S_F$, a resistor $R_1$ positioned between the junction point of the capacitor $C_1$ and the resistor $R_2$, and a capacitor $C_2$ positioned between the output $S_F$ and ground.

4. A circuit as claimed in claim 3, characterized in that in the circuit F the resistances $R_1$ and $R_2$ are constituted by the respective field-effect transistors $T_1$ and $T_2$, the source of the transistor $T_1$ being connected to ground, its drain being connected to the source of the transistor $T_2$ and to the terminal of the capacitor $C_1$ opposite the input E, and the grids of the transistors $T_1$ and $T_2$ being biased by a controllable D.C. voltage source $E_2$ to have the value of the resistors $R_1$ and $R_2$ and the frequency $f_1$ of the rejection of the filter vary, and in that the capacitor $C_2$ is constituted by intrinsic capacitances of the field-effect transistors $T_3$ and $T_4$ of an amplifier stage formed by two parallel-arranged transistors $T_3$ and $T_4$, their common source is connected to ground, their common drain to a D.C. supply voltage source $E_1$ via a load resistor $R_8$, the grids of the transistors $T_3$ and $T_4$ being controlled by the signal available at the drain of the processor $T_2$ via the respective capacitors $C_3$ and $C_4$, and these grids being in addition biased by the controllable D.C. voltage sources, $E_3$ via a resistor $R_3$ for the processor $T_3$ and $E_4$ via a resistor $R_4$ for the transistor $T_4$, respectively, the value of the D.C. voltage $E_3$ being chosen for a fine adjustment of the rejection value R of the filter, and the value of the D.C. voltage $E_4$ being chosen for a coarse adjustment of the gain ($-G_{PB}$) of the amplifier stage and the rejection R, the output signal $V_{PB}$ of the circuit F being available at the junction $S_F$ of the drains of the transistors $T_3$ and $T_4$.

5. A circuit as claimed in claim 4, characterized in that the amplifier block $A_2$ is constituted by a field-effect transistor $T_5$ whose source is connected to ground, the drain to the output S, and whose grid receives the signal $V_{PB}$ from the output of the block F via a capacitor $C_5$, the drain of this transistor $T_5$ being moreover brought to the supply voltage $E_1$ via the load resistor $R_9$ and the grid of this transistor $T_5$ being biased via a resistor $R_5$ by a controllable D.C. voltage source $E_5$ to have the gain ($-k_2$) of this amplifier block vary, and in that the amplifier block $A_1$ is formed by a field-effect transistor $T_6$ which is arranged in parallel with the transistor $T_5$ to effect the addition $S_3$, the grid of the transistor $T_6$ receiving the input signal $V_E$ of the circuit via a capacitor $C_6$ and being in addition biased via a resistor $R_6$ by the voltage source $E_5$ to have the gain $(-k_1)$ of this amplifier block vary.

6. A circuit as claimed in claim 5, characterized in that the load resistance $R_9$ of the transistors $T_5$ and $T_6$ is an active load constituted by a field-eefect transistor $T_7$ whose source is connected to the common drains of the transistors $T_5$ and $T_6$, and whose drain is brought to the D.C. supply voltage $E_1$, the bias of the grid of the transistor $T_7$ being realized by connecting it to the centre tap of a divider bridge formed by the resistors $R_7$ and $R'_7$ arranged between ground and the voltage $E_1$, and the grid being moreover connect to the source of $T_7$ via a capacitor $C_7$, and in that the load resistance $R_8$ of the transistors $T_3$ and $T_4$ is a resistor.

7. A circuit as claimed in anyone of the claims 5 or 6, characterized in that it has the function of a band-rejection filter for controlling the values of the voltages $E_1$, $E_2$, $E_3$, $E_4$, $E_5$, one iwht respect to the others to obtain the gains $k_1$, $k_2$, $G_{PB}$ of the amplifier blocks in such a manner that the band-rejection R of this circuit is higher than 1.

8. A circuit as claimed in anyone of the claims 5 or 6, characterized in that it has the function of an all-pass for controlling the values of the voltages $E_1$, $E_2$, $E_3$, $E_4$, $E_5$ one with respect to the others to obtain the gains $k_1$, $k_2$, $G_{PB}$ of the amplifier blocks in such a manner that the rejection factor $Q_1$ is opposed to the quality factor $Q_0$.

9. A circuit as claimed in anyone of the claims 5 or 6, characterized in that, for controlling the values of the voltages $E_3$ and $E_4$ with respect to the voltages $E_1$, $E_2$, $E_5$, to obtain the gain variations $k_1$, $k_2$, and $G_{PB}$ a continuous variation of the rejection factor $Q_1$ between $-\infty$ and $+\infty$ is obtained.

10. A circuit as claimed in anyone of the claims 4, 5 or 6 characterized in that it is integrated on a gallium-arsenide (GaAs) substrate and is obtained using field-effect transistors of a type which is normally conductive in the absence of a bias.

11. A circuit as claimed in claim 7, characterized in that it is integrated on a gallium-arsenide (GaAs) substrate and is obtained using field-effect transistors of a type which is normally conductive in the absence of a bias.

12. A circuit as claimed in claim 8, characterized in that it is integrated on a gallium-arsenide (GaAs) substrate and is obtained using field-effect transistors of a type which is normally conductive in the absence of a bias.

13. A circuit as claimed in claim 9, characterized in that it is integrated on a gallium-arsenide (GaAs) substrate and is obtained using field-effect transistors of a type which is normally conductive in the absence of a bias.

* * * * *